(12) United States Patent
Kirihata

(10) Patent No.: US 6,831,866 B1
(45) Date of Patent: Dec. 14, 2004

(54) METHOD AND APPARATUS FOR READ BITLINE CLAMPING FOR GAIN CELL DRAM DEVICES

(75) Inventor: Toshiaki K. Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,911

(22) Filed: Aug. 26, 2003

(51) Int. Cl.$^7$ .................................................. G11C 7/00
(52) U.S. Cl. .................................. 365/189.06; 365/210
(58) Field of Search ............................ 365/189.06, 210, 365/63

(56) References Cited

U.S. PATENT DOCUMENTS

| | | | |
|---|---|---|---|
| 4,816,706 A | | 3/1989 | Dhong et al. |
| 5,253,205 A | * | 10/1993 | Eaton, Jr. ............... 365/189.06 |
| 5,390,147 A | | 2/1995 | Smarandoiu et al. |
| 5,416,371 A | | 5/1995 | Katayama et al. |
| 5,577,001 A | | 11/1996 | Sandhu |
| 5,977,589 A | | 11/1999 | Schloesser et al. |
| 6,282,137 B1 | | 8/2001 | Lee et al. |
| 6,407,946 B2 | * | 6/2002 | Maruyama et al. ...... 365/185.2 |
| 6,512,714 B2 | | 1/2003 | Hanzawa et al. |
| 6,519,195 B2 | | 2/2003 | Kanno et al. |
| 6,567,330 B2 | * | 5/2003 | Fujita et al. ................. 365/210 |
| 2003/0123313 A1 | | 7/2003 | Hanzawa et al. |

* cited by examiner

Primary Examiner—Son T. Dinh
(74) Attorney, Agent, or Firm—Joseph P. Abate; Cantor Colburn LLP

(57) ABSTRACT

A dynamic random access memory (DRAM) storage device includes a storage cell having a plurality of transistors arranged in a gain cell configuration, the gain cell coupled to a read bitline and a write bitline. A dummy cell is configured as a clamping device for the read bitline, wherein the dummy cell opposes a read bitline voltage swing during a read operation of the storage cell.

18 Claims, 5 Drawing Sheets

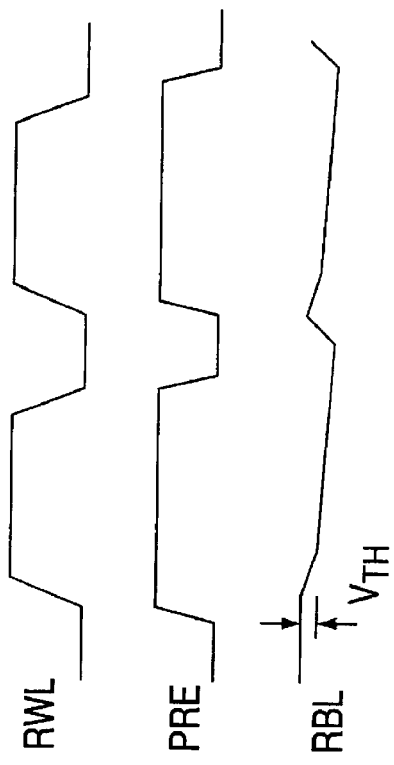
FIG. 3
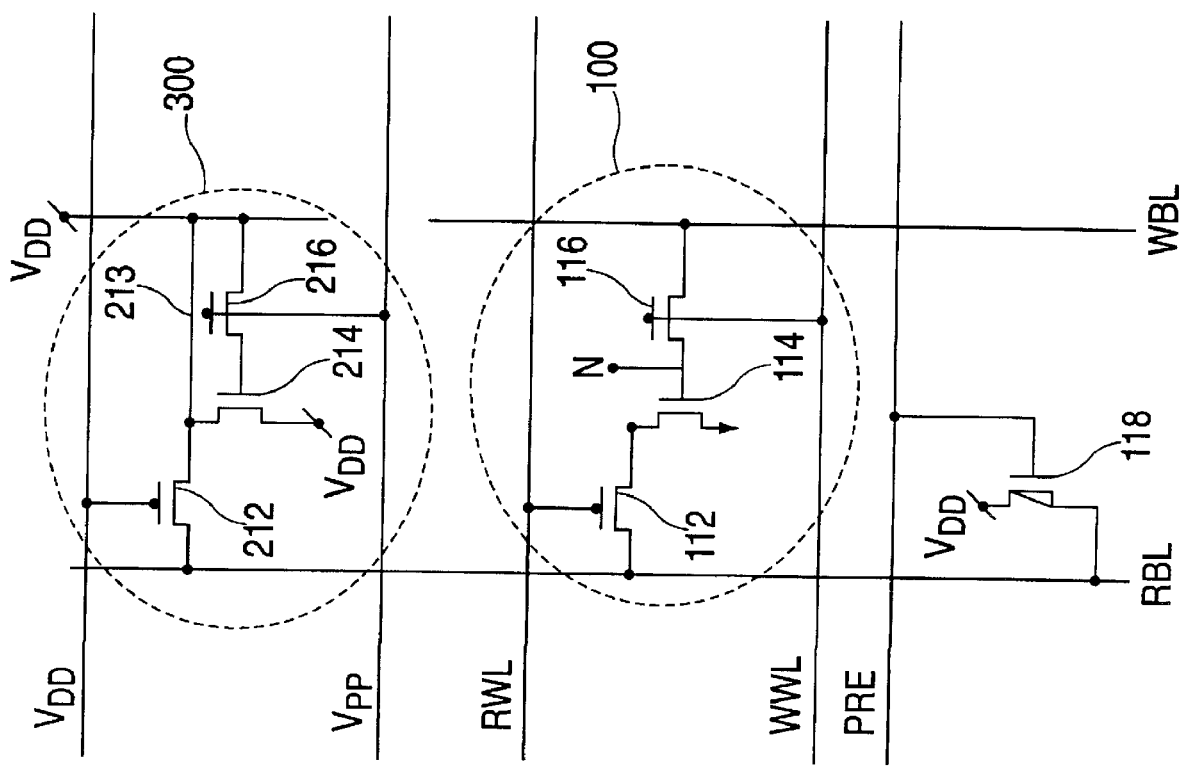

METHOD AND APPARATUS FOR READ BITLINE CLAMPING FOR GAIN CELL DRAM DEVICES

BACKGROUND OF INVENTION

The present invention relates generally to semiconductor memory devices and, more particularly, to a method and apparatus for read bitline clamping for three-transistor (3T) gain cell DRAM devices.

Dynamic Random Access Memory (DRAM) devices commonly employ a one-transistor memory cell arrangement that includes an access transistor and a storage capacitor. The information is stored in the storage capacitor in the form of an electrical charge that represents a logical level, 0 or 1. This information can be read out from or written to the cell by activating a wordline coupled to the access transistor via a word line. During a read operation, the electrical charge stored in the storage capacitor is transferred to a bitline and sensed by sense amplifier circuitry. During a write operation, electrical charge is added to or removed from the storage capacitor by the bitline.

Since the storage density increases from generation to generation of memory, the required surface area of the one-transistor memory cell must be reduced from generation to generation. This leads to fundamental technological and physical problems (particularly for performance), because the threshold voltage of an access transistor in a one-transistor memory cell is not reduced due to the device leakage. Yet, the operation voltage should be reduced to guarantee the device reliability.

This problem is avoided in one approach by an alternative DRAM cell arrangement wherein so-called "gain" cells are used as storage cells. Like the one-transistor/storage capacitor cell, data is also stored in gain cells in the form of an electrical charge. However, the electrical charge in a gain cell is not directly coupled to a bitline, but rather is stored in a gate electrode of a gain transistor (thereby controlling the conductivity of that transistor), for which purpose a very small amount of electrical charge is sufficient. Because gain cells do not require an electrical charge for signal storage, the capacitance of the cell can be reduced significantly. This results in a relatively short time constant as compared to the conventional one transistor memory cell with a large storage capacitance. In addition, as long as the storage node voltage is higher than the threshold voltage of the gain transistor, the device is turned on, further improving performance.

In a gain cell 100 having a three-transistor (3T) configuration such as shown in FIG. 1, the electrical charge is stored in a first gate electrode of a first transistor 114 (i.e., a gain transistor). The writing or storage of the electrical charge therein occurs with the aid of a second transistor 116 (i.e., a write access transistor). In particular, the gate electrode N of the gain transistor 114 is connected to one of the source/drain regions of the write access transistor 116, while the other source/drain region of the write access transistor 116 is connected to a write bitline WBL. During a write operation to the gain cell 100, the gate electrode of the write access transistor 116 is activated via an appropriate signal on a write wordline WWL. This allows the gate electrode N of the gain transistor 114 to be coupled to the write bitline WBL through transistor 116. The amount of electrical charge stored in the node N (and thus the data bit information stored in the gain transistor gate electrode) is determined by the voltage present on the write bitline when the write wordline is activated. The gate capacitor of the gain transistor 114 keeps sufficient electrical charge at storage node N. Similar to a conventional one-transistor DRAM, the storage node N should be periodically refreshed to rewrite (maintain) the voltage at the node N before the charge has been lost completely.

The readout of stored information in a 3T gain cell occurs with the aid of a third transistor 112 (i.e., a read access transistor). One of the source/drain regions of the gain transistor 114 is connected to one of the source/drain regions of the read access transistor 112, while the other of the source/drain regions of the gain transistor 114 is connected to either $V_{DD}$ or ground, depending upon the type of the cell transistors (PFET or NFET). In addition, the other of the source/drain regions of the read access transistor is connected to a read bitline RBL. The read bitline RBL is precharged to either $V_{DD}$ or ground, again depending upon the type of the cell transistors (PFET or NFET). For example, in a 3T gain cell having NFET transistors, the read bitline is precharged to $V_{DD}$, and the other of the source/drain regions of the gain transistor is connected to ground, as shown in FIG. 1. During a read operation, the gate electrode of the read access transistor 112 is actuated via a read wordline RWL. This allows the drain of gain transistor 114 to be coupled to the read bitline RBL through the transistor 112. The read bit line is therefore determined by the conductance through the series combination of the read transistor 112 and gain transistor 114 coupling to ground.

In addition, FIG. 1 illustrates aPFET pull-up transistor 118 configured as a precharge device that dynamically precharges the read bitline RBL to the supply voltage $V_{DD}$. Thus, if the storage node N maintains a "1" data bit therein, the read bitline RBL is discharged down from $V_{DD}$ since both transistors 112 and 114 are conductive. On the other hand, if the storage node N maintains a "0" data bit therein, the read bitline RBL is not discharged from the precharge voltage since the gain transistor 114 is non-conductive. The presence of a RBL voltage swing (i.e., reading "1" data) is detected by appropriate sense amplifier circuitry (not shown), which is well known and therefore not discussed in further detail hereinafter. After the read operation of the cell data is completed, the RBL precharge device 118 is turned on (i.e., the signal on precharge line PRE goes low) to restore the read bitline voltage to $V_{DD}$.

One problem associated with the above described cell configuration results during a read operation of a cell having a "1" stored therein (using NFET transistors in the cell). In this case, the activation of the read wordline, combined with the gate of the gain transistor being activated as a result of storing a "1", causes the read bitline to be discharged toward ground. In order to provide desired fast access speed, a rapid RBL swing is needed to sense the "1" data (it is noted that no bitline swing occurs when reading a "0" since the gain transistor is not conductive). However, if the read bitline swing is too fast, the voltage on the read bitline goes to ground, thereby resulting a longer restore time to return the read bitline voltage back to $V_{DD}$. As also mentioned previously, the circuit of FIG. 1 provides a fast access speed for reading "1" data as a result of the fast RBL swing.

A typical known solution is to include a read bitline clamp device to limit a read bitline swing. Without this clamp device, the voltage on read bitline RBL (in worst case) goes to ground. This condition results in a longer restore time for returning the RBL voltage back to $V_{DD}$. If the clamp device is implemented by substituting it for a dynamically controlled precharge device, the restore time is improved, but at the cost of a slower read bitline swing. This is due to the fact that a read access transistor needs to be able drive the read bitline RBL to ground. However, some of the current is also used for the clamp device coupling to $V_{DD}$. In addition, the clamp device must be laid out for each column, which increases the silicon area. Furthermore, the conventional use of a separate clamping device does not allow for "tracking" of variations in certain memory cell transistor and voltage parameters. Thus, it is desirable to have a gain transistor DRAM cell configuration that has both a fast read bitline voltage and an improved restore time, while also allowing for device process tracking and without sacrificing device real estate area.

SUMMARY OF INVENTION

The foregoing discussed drawbacks and deficiencies of the prior art are overcome or alleviated by a dynamic random access memory (DRAM) storage device. In an exemplary embodiment, a storage cell has a plurality of transistors arranged in a gain cell configuration, the gain cell coupled to a read bitline and a write bitline. A dummy cell is configured as a clamping device for the read bitline, wherein the dummy cell opposes a read bitline voltage swing during a read operation of the storage cell.

In another aspect, a method for clamping a read bitline of a gain access dynamic random access memory (DRAM) device having a plurality of storage cells associated therewith includes configuring a dummy cell as a clamping device for the read bitline, wherein the dummy cell opposes a read bitline voltage swing during a read operation of one of the plurality of storage cells.

BRIEF DESCRIPTION OF DRAWINGS

Referring to the exemplary drawings wherein like elements are numbered alike in the several Figures:

FIG. 3 is a schematic diagram of an alternative embodiment of the dummy cell configuration of FIG. 2;

DETAILED DESCRIPTION

Disclosed herein is a method and apparatus for read bitline clamping of three-transistor (3T) gain cell DRAM devices, in which a dummy gain cell is configured as a bitline clamp device for each column. When the read bitline voltage drops below the threshold of the read access transistor of the dummy gain cell during a read operation, the read access transistor turns on, limiting the read bitline swing by providing a conductive path from $V_{DD}$. This allows for a fast recovery for subsequent read cycles. In addition, by dynamically controlling a dummy read wordline and a dummy write wordline, the time constant of the storage transistor in both read and write modes may be tracked.

Figure 1:
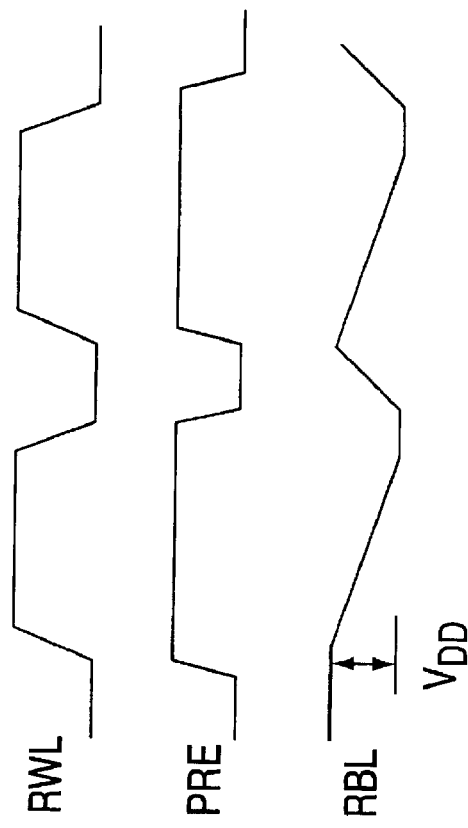
FIG. 1 is a schematic diagram of an existing three transistor (3T) gain cell for a DRAM device.
Figure 1:
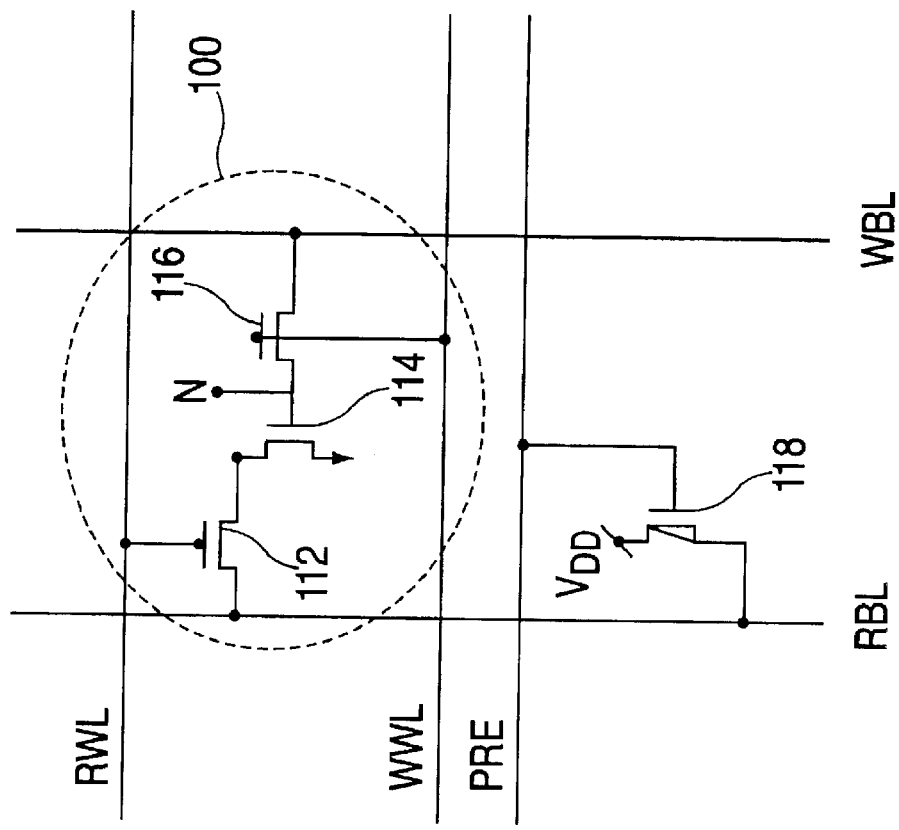
Figure 2:
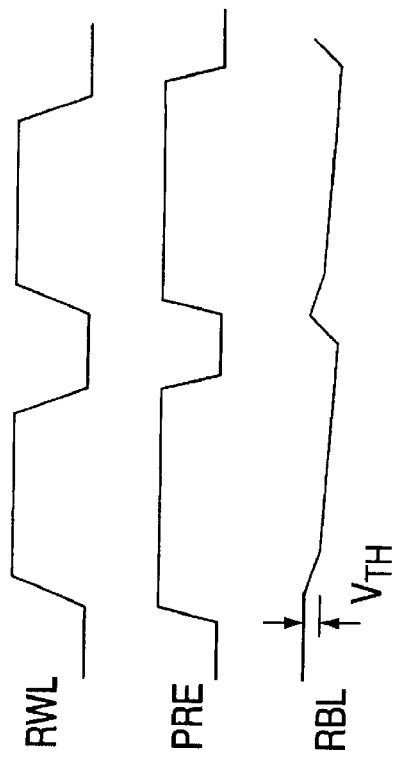
FIG. 2 is a schematic diagram of a 3T gain cell with a dummy cell configured as a read bitline clamping device, in accordance with an embodiment of the invention.
Figure 2:
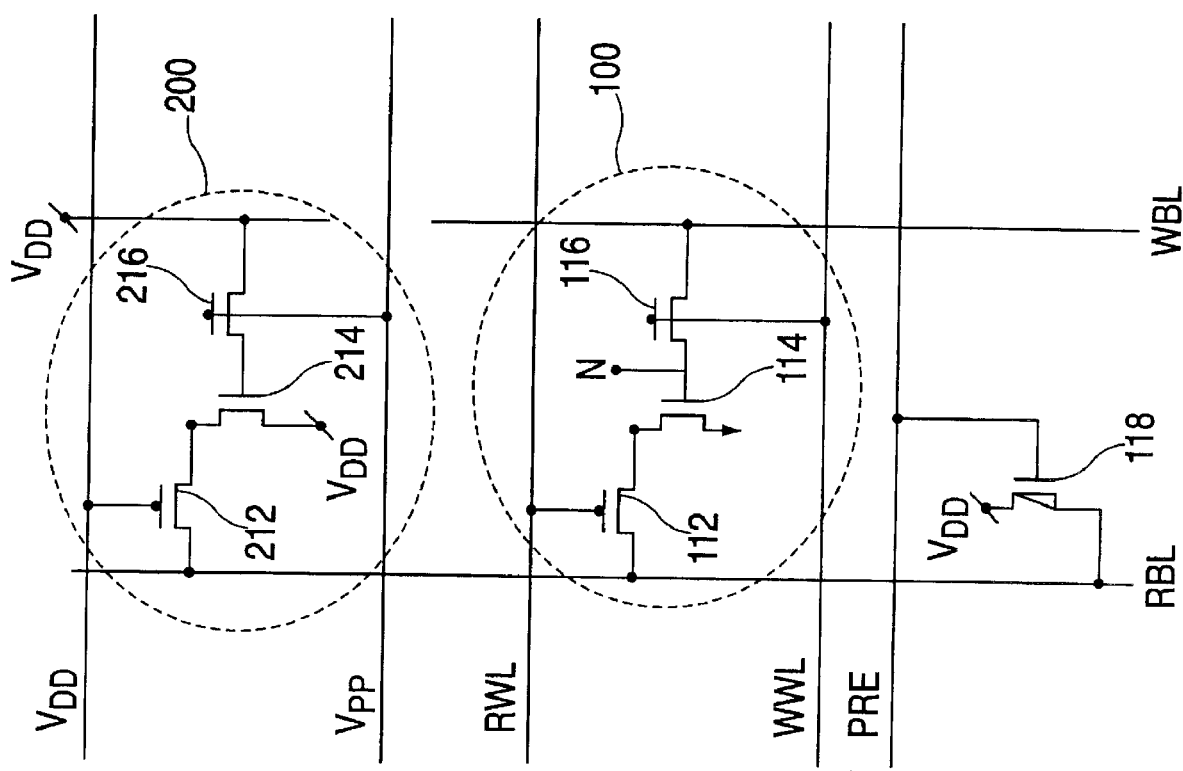

In accordance with an embodiment of the invention, FIG. 2 is schematic diagram of a 3T gain cell 100 with a dummy cell 200 configured as a read bitline clamping device. In a practical implementation, a separate dummy cell 200 is associated with each column of a gain cell array. It will further be appreciated that there may be multiple gain cells 100 configured within an individual column, and thus FIG. 2 should only be interpreted in an illustrative sense only. As is the case with each of the gain cells 100 of a memory element, the dummy cell 200 is also a 3T cell having a read access transistor 212, gain transistor 214, and write access transistor 216. Moreover, because the dummy cell 200 is already integrated in the array, the silicon area used for this purpose is negligible compared with a conventional clamping method. This integration also provides a further benefit by tracking certain process deviations, such as the voltage threshold of the memory cell, for example.

Unlike the other gain cells 100 used for memory storage elements, both the gate of read access transistor 212 and the source of gain transistor 214 are coupled to a nominal logic power supply voltage $V_{DD}$ in the embodiment of FIG. 2. The drain of the write transistor 216 is also coupled to $V_{DD}$, while the gate thereof is coupled to a wordline-boosted voltage ($V_{PP}$). The wordline-boosted voltage $V_{PP}$ is higher than $V_{DD}$ by an amount at least equal to the voltage threshold of transistor 216 so as to maintain it in a conductive state. Ideally, the $V_{PP}$ voltage is same as the voltage for the write wordline (WWL) for the high state, which allows tracking the threshold effect of the write access transistor 116. More particularly, if $V_{PP}$ is less than $V_{DD}$ plus the threshold voltage of the write access transistor 116, then the node voltage would be limited by the threshold effect of the memory cell write transistor 116 regardless of the write bitline voltage of $V_{DD}$ in a write mode. By utilizing the $V_{PP}$ voltage coupled to the gate of the transistor 216, the maximum write voltage to the storage node N of the dummy device 210 simulates the storage node N of the actual memory cell 100 in a write mode.

In operation, the read bitline RBL is precharged at $V_{DD}$ in a stand-by state. As is the case for a conventional gain cell, during a read memory operation access, the signal on RWL goes high. If the data in the cell 100 is a "1" bit, conductive transistors 112 and 114 will begin to pull the voltage on RBL down for reading by the sense amplifier circuitry. However, once the RBL voltage drops from $V_{DD}$ by an amount equivalent to the voltage threshold ($V_{TH}$) of the read access transistor 212 of the dummy gain cell, the read access transistor 212 will then be rendered conductive. This causes $V_{DD}$ current to be supplied to the read bitline RBL through the series combination of transistors 212 and 214. As a result, the RBL swing is reduced once the RBL voltage has dropped to the level of $V_{DD}-V_{TH}$. In other words, the rate of discharge of RBL is much lower once it has dropped by $V_{TH}$. The timing diagram portion of FIG. 2 further illustrates the clamping effect. As can be seen, the overall amount of the voltage drop is reduced, which allows for a substantially faster RBL restore time. By the same token, the fast access time is still preserved, since the clamping effect does not take effect until RBL has dropped by $V_{TH}$, thus allowing the signal to develop on RBL and be sensed by the sense amplifier circuitry.

Because the dummy cell 200 has the same structure as the actual storage cell 100, transistor characteristics for the storage cell transistors (i.e., write access transistor 112, gain transistor 114, and write access transistor 116) may be simulated by the dummy cell transistors 212, 214 and 216. This minimizes the read bitline swing dependency to process, voltage and temperature variations. For example, if the voltage threshold ($V_t$) of the gain transistor 114 is relatively low with respect to a nominal range, the readbitline RBL will tend to be driven to low more strongly. Advantageously, the $V_t$ of the transistor 214 would also be relatively low, thus tending to maintain RBL at high more strongly to compensate. In addition, the storage node voltage for "1" data with respect to the $V_t$ of the write transistor 116 is simulated by transistor 216, the gate terminal of which is coupled to the $V_{PP}$ or WWL high voltage, as discussed previously.

Figure 4:
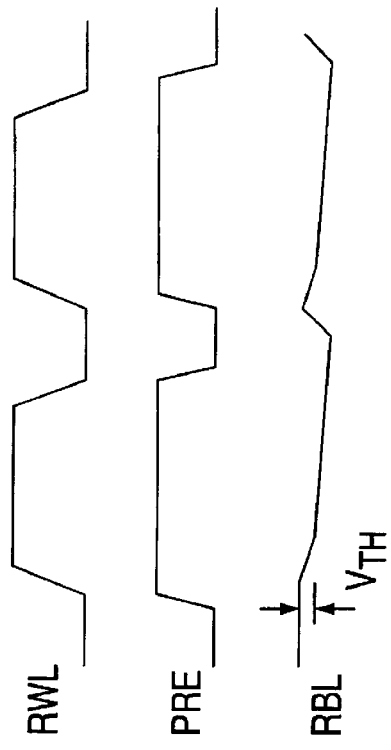
FIG. 4 is a schematic diagram of another alternative embodiment of the dummy cell configuration of FIGS. 2 and 3.
Figure 4:
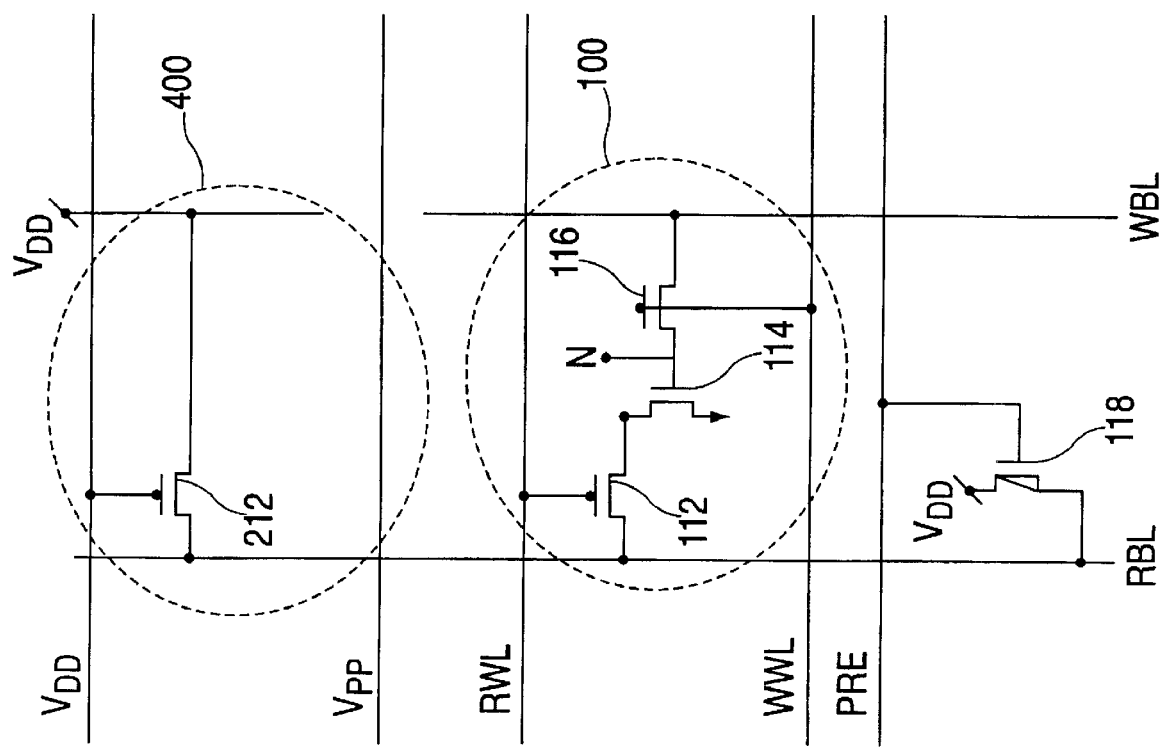

The use of a dummy cell as a read bitline clamping device may be implemented in a variety of alternative configurations. For example, in FIG. 3, the dummy gain cell 300 is configured in a manner similar to the embodiment of FIG. 2, only with an additional node connection 213. By directly connecting $V_{DD}$ to the source of the read access transistor 212, transistors 214 and 216 are effectively shorted out (although they are maintained in the dummy cell 200 to keep a regular array structure for lithography purposes). An advantage to this configuration is that the clamping current provided to RBL can be increased. On the other hand, by effectively eliminating the function of transistors 214 and 216, process variations in corresponding transistors in the array cells are not tracked by the clamping device. As is shown in FIG. 4, it will be appreciated that transistors 214 and 216 may be eliminated from the dummy gain cell 400 altogether, while maintaining the structure of the transistor 212 in the same configuration as the transistor 112 for memory cell 100.

Figure 5:
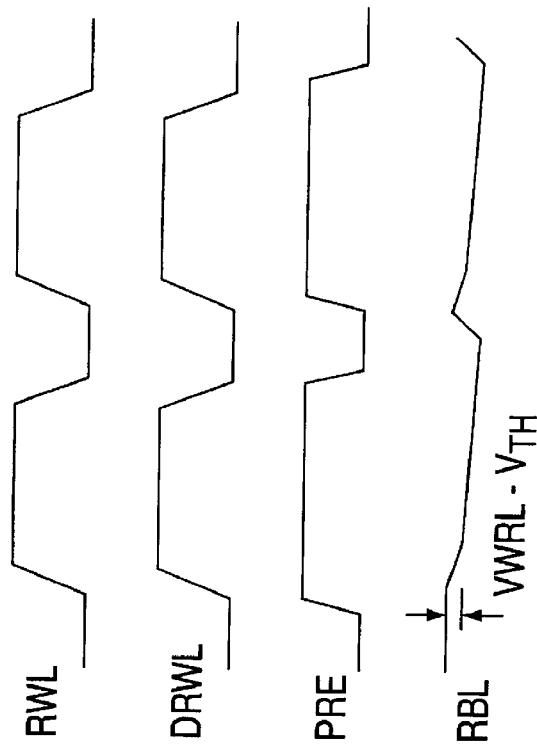
FIG. 5 is a schematic diagram of a 3T gain cell with a dynamically controlled dummy cell configured as a read bitline clamping device, in accordance with still another embodiment of the invention.
Figure 5:
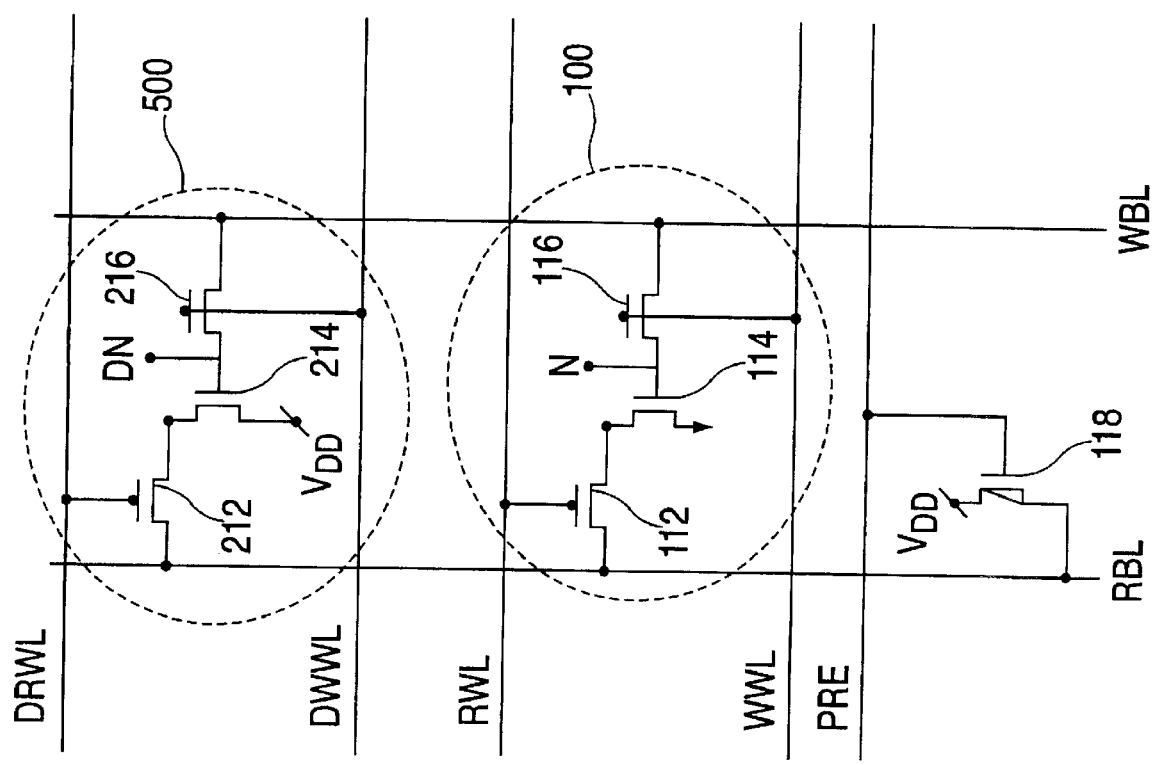

Finally, FIG. 5 illustrates still another embodiment of a dummy gain cell 500 configured as a clamping device. This embodiment is similar to the embodiment of FIG. 2, with the exception that instead of using $V_{DD}$ and $V_{PP}$ for the cell transistor connections, a dummy read wordline (DRWL) and a dummy write wordline (DWRL) are provided. Although the source of the gain transistor 214 is still coupled to $V_{DD}$, both the DRWL and DWWL are dynamically controlled. This allows for simulation of a time constant for writing a voltage to the storage node N in a write mode. In particular, during the power-on phase, the dummy gain cell 500 is written to "high" by application of appropriate control signals to DWWL and WBL, similar to a write operation for the actual memory cells 100. Alternatively, the DWWL can be activated periodically to store the voltage to the storage node of the dummy gain cell 500. The activation period may coincide with the refresh period for the storage cell 100.

During a read mode, both RWL and DRWL are turned on simultaneously (as shown in the timing diagram portion in FIG. 5). Assuming that the dummy storage node DN maintains a high voltage, the RBL will be clamped at a read wordline high voltage (VRWL) voltage-$V_{TH}$. This allows for additional tracking of any VRWL voltage and timing deviations. It will be noted, however, that this dynamic effect cannot be simulated in the embodiment of FIG. 2. Optionally, the DRWL high voltage may be different from the RWL high voltage in order to optimize the voltage clamp level. As is the case for the actual memory cells, the dummy cell 500 should be periodically refreshed to allow for tracking of the "1" bit voltage stored in the dummy node DN.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A dynamic random access memory (DRAM) storage device, comprising:
    a storage cell having a plurality of transistors arranged in a gain cell configuration, said gain cell coupled to a read bitline and a write bitline; and
    a dummy cell, said dummy cell configured as a clamping device for said read bitline, wherein said dummy cell opposes a read bitline voltage swing during a read operation of said storage cell.

2. The storage device of claim 1, wherein said dummy cell further comprises at least one transistor corresponding in the configuration thereof to said plurality of transistors of said storage cell.

3. The storage device of claim 1, wherein said storage cell and said dummy cell are further configured in a three-transistor (3T) arrangement.

4. The storage device of claim 1, wherein:
    a gain transistor of said dummy cell is configured to supply current to said read bitline when the voltage on said bitline drops, from an initial precharge voltage, in an amount at least equivalent to the threshold voltage of a write access transistor of said dummy cell.

5. The storage device of claim 1, wherein said dummy cell further comprises a write access transistor having a gate terminal coupled to a nominal logic supply voltage, $V_{DD}$, one of a source and drain terminal coupled to $V_{DD}$, and the other of said source and drain terminal coupled to said read bitline.

6. The storage device of claim 1, wherein:
    said storage cell is coupled to a read wordline and a write wordline; and
    said dummy cell is coupled to a dummy read wordline and a dummy write wordline.

7. The storage device of claim 6, wherein during a read operation of said storage cell, said dummy read wordline is activated at the same time as said read wordline.

8. The storage device of claim 1, wherein a write access transistor within said dummy cell has one of a source and a drain terminal coupled to a nominal logic supply voltage, $V_{DD}$, and a gate terminal coupled to a wordline-boosted voltage, $V_{PP}$, wherein $V_{PP}$ is higher that $V_{DD}$ by an amount at least equal to the voltage threshold of said write access transistor.

9. A method for clamping a read bitline of a gain access dynamic random access memory (DRAM) device having a plurality of storage cells associated therewith, the method comprising:
    configuring a dummy cell as a clamping device for the read bitline, wherein said dummy cell opposes a read bitline voltage swing during a read operation of one of the plurality of storage cells.

10. The method of claim 9, wherein the storage cells and said dummy cell are further configured in a three-transistor (3T) arrangement.

11. The method of claim 9, further comprising:
    configuring a gain transistor of said dummy cell to supply current to the read bitline when the voltage on the bitline drops, from an initial precharge voltage, in an amount at least equivalent to the threshold voltage of a write access transistor of said dummy cell.

12. The method of claim 10, wherein said dummy cell further comprises a write access transistor having a gate terminal coupled to a nominal logic supply voltage, $V_{DD}$, one of a source and drain terminal coupled to $V_{DD}$, and the other of said source and drain terminal coupled to the read bitline.

13. The method of claim 9, further comprising:

coupling the storage cells to a read wordline and a write wordline; and coupling said dummy cell to a dummy read wordline and a dummy write wordline.

14. The method of claim 13, further comprising activating said dummy read wordline at the same time as said read wordline during a read operation of one of said storage cells.

15. The method of claim 9, wherein a write access transistor within said dummy cell has one of a source and a drain terminal coupled to a nominal logic supply voltage, $V_{DD}$, and a gate terminal coupled to a wordline-boosted voltage, $V_{PP}$, wherein $V_{PP}$ is higher that $V_{DD}$ by an amount at least equal to the voltage threshold of said write access transistor.

16. The method of claim 14, further comprising:

during a power-on phase, activating said dummy write wordline so as to store a voltage within a dummy storage node.

17. The method of claim 14, further comprising:

periodically activating said dummy write wordline so as to maintain a voltage within a dummy storage node.

18. The method of claim 17, wherein said periodically activating said dummy wordline coincides with a refresh operation for the plurality of storage cells.

* * * * *